(12) United States Patent
Inoue et al.

(10) Patent No.: US 9,585,248 B2
(45) Date of Patent: Feb. 28, 2017

(54) RESIN COMPOSITION, RESIN VARNISH, PREPREG, METAL-CLAD LAMINATED BOARD AND PRINTED WIRING BOARD

(71) Applicant: PANASONIC INTELLECTUAL PROPERTY MANAGEMENT CO., LTD., Osaka (JP)

(72) Inventors: Hiroharu Inoue, Osaka (JP); Shingo Yoshioka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/988,085

(22) Filed: Jan. 5, 2016

(65) Prior Publication Data

US 2016/0143135 A1 May 19, 2016

Related U.S. Application Data

(63) Continuation of application No. 14/446,650, filed on Jul. 30, 2014.

(30) Foreign Application Priority Data

Aug. 1, 2013 (JP) ................................. 2013-160215
Oct. 22, 2013 (JP) ................................. 2013-219022

(51) Int. Cl.
| | | |
|---|---|---|
| B32B 15/08 | (2006.01) | |
| B32B 15/09 | (2006.01) | |
| B32B 15/092 | (2006.01) | |
| B32B 15/098 | (2006.01) | |
| B32B 27/04 | (2006.01) | |
| C09J 163/00 | (2006.01) | |
| H05K 1/03 | (2006.01) | |
| C08L 63/00 | (2006.01) | |
| C08J 5/24 | (2006.01) | |
| C08L 79/08 | (2006.01) | |
| C09D 163/00 | (2006.01) | |
| C09D 179/08 | (2006.01) | |
| C08G 59/24 | (2006.01) | |
| C08G 59/62 | (2006.01) | |

(52) U.S. Cl.
CPC ......... *H05K 1/0373* (2013.01); *C08G 59/245* (2013.01); *C08J 5/24* (2013.01); *C08L 63/00* (2013.01); *C08L 79/08* (2013.01); *C09D 163/00* (2013.01); *C09D 179/08* (2013.01); *H05K 1/0353* (2013.01); *B32B 2311/00* (2013.01); *B32B 2457/08* (2013.01); *C08G 59/621* (2013.01); *C08J 2363/00* (2013.01); *C08J 2379/08* (2013.01); *C08J 2433/00* (2013.01); *C08L 2203/20* (2013.01); *C08L 2205/03* (2013.01); *H05K 1/0346* (2013.01); *H05K 1/0366* (2013.01); *H05K 2201/0162* (2013.01); *H05K 2201/09136* (2013.01); *Y10T 156/10* (2015.01); *Y10T 428/31529* (2015.04)

(58) Field of Classification Search
None
See application file for complete search history.

(56) References Cited

U.S. PATENT DOCUMENTS

| | | | | |
|---|---|---|---|---|
| 5,258,139 A | * | 11/1993 | Ichimura | ................ C08G 59/12 252/500 |
| 2004/0105990 A1 | * | 6/2004 | Shiobara | .................. B32B 7/12 428/473.5 |
| 2009/0266591 A1 | * | 10/2009 | Amou | ........................ C08J 5/24 174/258 |
| 2011/0006441 A1 | * | 1/2011 | Terai | ................... C09D 133/062 257/777 |
| 2011/0084409 A1 | * | 4/2011 | Sugino | ................ H01L 23/3121 257/783 |
| 2011/0149532 A1 | * | 6/2011 | Takahashi | ............... B32B 15/14 361/748 |
| 2014/0000948 A1 | | 1/2014 | Nagai et al. | |
| 2014/0027163 A1 | * | 1/2014 | Min | ..................... H05K 1/0271 174/257 |
| 2014/0367150 A1 | * | 12/2014 | Inoue | ........................ C08J 5/24 174/255 |
| 2015/0075852 A1 | * | 3/2015 | Inoue | ................... C09D 163/00 174/258 |

FOREIGN PATENT DOCUMENTS

| | | | | |
|---|---|---|---|---|
| JP | WO 2014/050034 A1 | * | 4/2014 | ............... C08J 5/24 |
| WO | 2012/099134 | | 7/2012 | |

\* cited by examiner

*Primary Examiner* — Robert Sellers
(74) *Attorney, Agent, or Firm* — Greenblum & Bernstein, P.L.C.

(57) ABSTRACT

A resin composition that becomes a cured product that exhibits force response behavior such that an area surrounded by a tensile stress-strain curve f1(x), when an amount of strain is increased from 0% to 0.3% by pulling at 999 μm/min while plotting the amount of strain on the x axis and tensile stress on the y axis, and also surrounded by the x axis, is greater than an area surrounded by a stress-strain curve f2(x), when the amount of strain is decreased from 0.3%, and also surrounded by the x axis, and the amount of change in the amount of strain when tensile stress is 0, before and after applying tensile stress, is 0.05% or less.

12 Claims, 1 Drawing Sheet

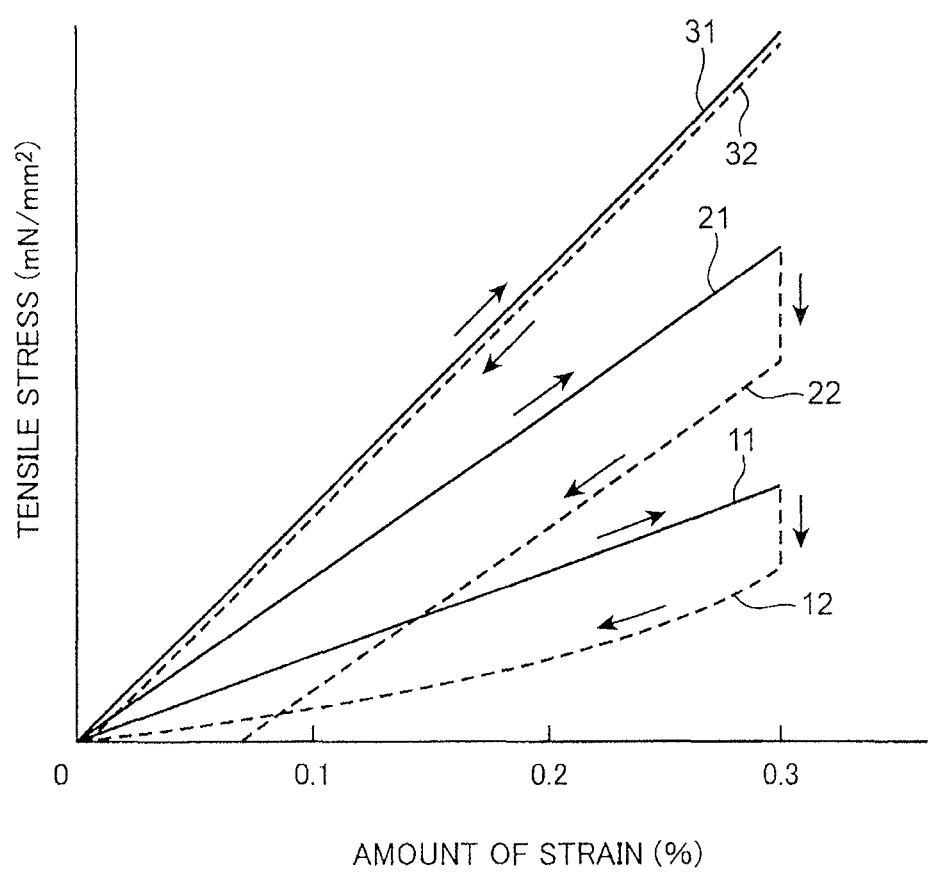

RESIN COMPOSITION, RESIN VARNISH, PREPREG, METAL-CLAD LAMINATED BOARD AND PRINTED WIRING BOARD

CROSS-REFERENCE TO RELATED APPLICATIONS

This application is a continuation of U.S. patent application Ser. No. 14/446,650, filed on Jul. 30, 2014, which claims the benefit of Japanese Application No. 2013-160215 filed Aug. 1, 2013 and Japanese Application No. 2013-219022 filed Oct. 22, 2013, the contents of which being incorporated by reference in their entirety.

FIELD OF THE INVENTION

The present invention relates to a resin composition, a resin varnish, a prepreg, a metal-clad laminated board and a printed wiring board.

BACKGROUND OF THE INVENTION

Accompanying the reduced size and thickness of electronic devices, surface mount packages are being increasingly used for electronic components provided in these electronic devices. Examples of such packages include packages in which a semiconductor chip is mounted on a board such as a chip-on-board (BOC) package. These packages employ a structure in which the semiconductor chip and board are bonded. Consequently, warpage and other forms of package deformation occurred due to temperature changes attributable to a difference in the coefficient of thermal expansion (CTE) between the semiconductor chip and the board. In addition, as this warpage increases, force that acts to separate the semiconductor chip and board becomes large, thereby causing a decrease in connection reliability between the semiconductor chip and board in these packages.

In addition, electronic devices are being required to become even smaller and thinner. In order to satisfy these demands, efforts are being made to reduce the size and thickness of electronic components, and studies are being conducted to reduce the thickness of the boards that compose the packages of electronic components. In the case of a board that has been reduced in thickness in this manner, there tends to be increased susceptibility to the occurrence of warpage, thereby requiring these boards to more effectively inhibit the occurrence of warpage.

Moreover, in order to make electronic devices multifunctional, it is necessary to increase the number of electronic components installed therein. In order to satisfy this requirement, a type of package known as a Package on Package (PoP) is employed in which a plurality of sub-packages are laminated and mounted on a board followed by integrating into a single package. For example, these PoP are frequently employed in portable terminal devices such as Smartphones or tablet computers. In addition, since these PoP are of a form in which a plurality of sub-packages are laminated, the connection reliability of each sub-package becomes important. In order to enhance this connection reliability, it is necessary to reduce warpage of each package that is used as a sub-package.

On the basis thereof, studies have been conducted on the development of board materials that enable the production of boards that are able to adequately inhibit warpage even in the case of packages using boards of reduced thickness. An example of these board materials is the resin composition described in WO 2012/099134.

WO 2012/099134 describes a resin composition containing a maleimide compound having at least two N-substituted maleimido groups in the structure of a single molecule thereof and a silicone compound having at least one amino group in the structure of a single molecule thereof.

According to WO 2012/099134, it is disclosed to the effect that a multilayer printed wiring board can be produced that has superior glass transition temperature, coefficient of thermal expansion, soldering heat resistance and warpage characteristics, and is useful as a printed wiring board for electronic devices.

However, when using a board obtained using the resin composition described in WO 2012/099134, there are cases in which a package is unable to be obtained that adequately inhibits warpage and other deformation that occurs due to changes in temperature.

In this manner, a bonded body obtained by bonding two or more members made of different materials is subjected to stress in the direction in which warpage occurs caused by a change in temperature that is due to a difference in the coefficient of thermal expansion of each member. Consequently, in the case of a bonded body in which two or members made of different material are bonded, the problem of the occurrence of warpage caused by a change in temperature may occur in the same manner as in the case of the packages described above. In addition, the problem may also occur in which the bonded state of two members may be unable to be maintained. It is therefore necessary to inhibit the occurrence of such problems.

With the foregoing in view, an object of the present invention is to provide a resin composition that allows the obtaining of a compact that adequately inhibits the occurrence of warpage even in the case of bonding to another member. In addition, an object of the present invention is to provide a resin varnish, a prepreg, a metal-clad laminated board and a printed wiring board that use this resin composition.

SUMMARY OF THE INVENTION

A resin composition according to one aspect of the present invention is such that a cured product obtained by curing this resin composition exhibits force response behavior in which an area surrounded by the following tensile stress-strain curve $f1(x)$ and the x axis is greater than an area surrounded by the following tensile stress-strain curve $f2(x)$ and the x axis. Furthermore, the tensile stress-strain curve $f1(x)$ described here has the amount of strain plotted on the x axis, tensile stress plotted on the y axis, and is a tensile stress-strain curve when the amount of strain by pulling at 999 μm/min is increased from 0% to 0.3%. Moreover, the tensile stress-strain curve $f2(x)$ is a tensile strain-strain curve when the amount of strain is decreased from 0.3%. In addition, the cured product exhibits force response behavior such that the amount of change in the amount of strain when tensile stress is 0 before and after applying tensile stress is 0.05% or less.

In addition, a resin varnish according to another aspect of the present invention contains the resin composition and a solvent.

In addition, a prepreg according to another aspect of the present invention is obtained by impregnating a fibrous base material with the resin varnish.

In addition, a metal-clad laminated board according to another aspect of the present invention is obtained by laminating a metal foil on the prepreg, followed by hot press molding.

In addition, a printed wiring board according to another aspect of the present invention is produced by using the prepreg.

BRIEF DESCRIPTION OF THE DRAWING

FIG. 1 is a schematic diagram showing a type of force response behavior of a resin composition according to an embodiment of the present invention.

DETAILED DESCRIPTION OF THE INVENTION

According to studies conducted by the inventors of the present invention, materials proposed as board materials for reducing package warpage, including the resin composition described in WO 2012/099134, were developed for the purpose of enhancing modulus of elasticity and lowering coefficient of thermal expansion. As a result of enhancing modulus of elasticity, the rigidity of the board per se increases, the board becomes resistant to bending, and the occurrence of warpage is thought to be able to be inhibited. In addition, if the coefficient of thermal expansion is lowered, the difference in coefficient of thermal expansion with a semiconductor chip becomes small, and force that acts to bend the substrate is thought to become weak.

However, even if using a board material developed for the purposes described above, there were cases in which a package was unable to be obtained that adequately inhibited warpage and other deformation occurring due to a change in temperature as previously described. In addition, even if the occurrence of warpage was able to be adequately inhibited, the range of materials that can be selected for that board material was narrow, and heat resistance and other requirements were unable to be adequately satisfied.

Therefore, as a result of focusing on inhibiting the occurrence of warpage by intentionally lowering modulus of elasticity and causing deformation of the board per se, and further conducting extensive studies on conditions that enable the occurrence of warpage to be adequately inhibited, the inventors of the present invention defined a relationship according to a tensile stress-strain curve, thereby leading to completion of the present invention as indicated below.

Although the following provides an explanation of embodiments according to the present invention, the present invention is not limited thereto.

The resin composition according to the present embodiment is such that a cured product obtained by curing this resin composition exhibits force response behavior like that described below. More specifically, an example thereof is a resin composition that allows the obtaining of a cured product that exhibits behavior like that shown in FIG. 1. Furthermore, FIG. 1 is a schematic diagram (graph) showing a type of force response behavior of the resin composition according to the present embodiment. At that time, tensile stress is plotted on the vertical axis (y axis) while the amount of strain is plotted on the horizontal axis (x axis).

In addition, FIG. 1 indicates the force response behavior of the resin composition according to the present embodiment in which a tensile stress-strain curve $f1(x)$, when the amount of strain has been increased from 0% to 0.3% by pulling at 999 μm/min, is represented by a curve 11, and a tensile stress-strain curve $f2(x)$, when the amount of strain has been decreased from 0.3%, is represented by a curve 12. In addition, this graph indicates not only the force response behavior of the resin composition according to the present embodiment, but also that for an elastic deformation resin, plastic deformation and the like. Furthermore, in FIG. 1, the force response behavior of a plastic deformation resin is indicated by representing a tensile stress-strain curve $f1'(x)$ when the amount of strain has been increased from 0% to 0.3% with a curve 21 and representing a tensile stress-strain curve $f2'(x)$ when the amount of strain has been decreased from 0.3% with a curve 22. In FIG. 1, the force response behavior of an elastic deformation resin is indicated by representing a tensile stress-strain curve $f1''(x)$ when the amount of strain has been increased from 0% to 0.3% with a curve 31 and representing a tensile stress-strain curve $f2''(x)$ when the amount of strain has been decreased from 0.3% with a curve 32. Furthermore, the curves 31 and 32 are roughly straight lines.

First, the force response behavior of the resin composition according to the present embodiment is such that force response behavior is exhibited in which the area surrounded by the following tensile stress-strain curve $f1(x)$ 11, the vertical line at X=0.3 and the x axis (first area) is greater than the area surrounded by the following tensile stress-strain curve $f2(x)$ 12, the vertical line at X=0.3 and the x axis (second area) as shown in FIG. 1. Furthermore, the tensile stress-strain curve $f1(x)$ referred to here is the tensile stress-strain curve when the amount of strain has been increased from 0% to 0.3%. In addition, the tensile stress-strain curve $f2(x)$ is the tensile stress-strain curve when the amount of strain has been decreased from 0.3% to the strain amount at tensile stress of 0%. Namely, the tensile stress-strain curve $f1(x)$ and the tensile stress-strain curve $f2(x)$ are different, and the load applied during relaxation so as to decrease the amount of strain from 0.3% is smaller than the load applied when pulling so as to increase the amount of strain from 0% to 0.3%.

In addition, even in the case of a resin composition in which the first area and the second area are the same, the first area may be larger than the second area due to measurement error and the like. The first area being larger than the second area may indicate that the first area is substantially larger than the second area, excluding such a case of measurement error.

In addition, the cured product exhibits force response behavior such that the amount of change in the amount of strain when tensile stress is 0 before and after applying tensile stress is 0.05% or less. Namely, when deformation is relaxed after having pulled the cured product to an amount of strain of 0.3%, the cured product returns to roughly the same shape as the shape prior to applying tensile stress. As shown in FIG. 1, the amount of strain when tensile stress is 0 before and after applying tensile stress is preferably completely unchanged and returns to the origin.

A resin composition from which is obtained a cured product that exhibits such force response behavior allows the obtaining of a compact in which the occurrence of warpage is adequately inhibited even in the case of having been bonded to another member. For example, a printed wiring board bonded to a semiconductor chip is obtained that is able to adequately inhibit the occurrence of package warpage. In addition, this resin composition also allows the production of an insulating film in which the occurrence of warpage is inhibited even if bonded to a member of a different material in addition to a printed wiring board bonded to a semiconductor chip.

In addition, since a resin composition from which is obtained a cured product as described above allows a compact obtained using the resin composition per se to deform corresponding to a dimensional change caused by a change in temperature even if another member is bonded to the compact, the occurrence of warpage is thought to be adequately inhibited.

In addition, the load applied during relaxation when the amount of strain is decreased from 0.3% is smaller than the load applied during pulling so that the amount of strain is increased from 0% to 0.3% as previously described. On the basis thereof, when deformation of a compact returns to its original shape, it is thought to return slowly. Accordingly, the compact per se is thought to be able to deform so as to adequately inhibit the occurrence of warpage.

In addition, since the amount of strain when tensile stress is 0 is small as previously described, it is thought to be able to adequately accommodate additional dimensional changes caused by a change in temperature. On the basis thereof, the resin composition is thought to allow the obtaining of a compact in which the occurrence of warpage is adequately inhibited.

In contrast thereto, first in the case of a plastic deformation resin, as shown in FIG. 1, force response behavior is exhibited in which the area surrounded by the tensile stress-strain curve f1'(x) 21, the vertical line at X=0.3 and the x axis is greater than the area surrounded by the tensile stress-strain curve f2'(x) 22, the vertical line at X=0.3 and the x axis in the same manner as the resin composition according to the present embodiment. On the basis thereof, the load applied during relaxation when the amount of strain decreases from 0.3% can be understood to be smaller than the load applied when pulling so that the amount of strain increases from 0% to 0.3%. On the basis thereof, in the case where stress is applied to a compact obtained using a resin composition, the compact is thought to return slowly when the deformed compact returns to its original shape after having been deformed. Furthermore, examples of plastic deformation resins include polyethylene and polypropylene.

However, as shown in FIG. 1, a plastic deformation resin differs from the resin composition according to the present embodiment in that the amount of change in the amount of strain when tensile strain is 0 before and after applying tensile stress exceeds 0.5%. Namely, a plastic deformation resin is thought to not return to its original shape even if tensile strain is released. Consequently, a compact obtained by using this resin is thought to not return to its original shape even if deformed as a result of the application of stress. On the basis thereof, since deformation of this compact per se is not deformation corresponding to a dimensional change caused by a change in temperature, it is thought to be unable to adequately inhibit the occurrence of warpage. Furthermore, examples of elastic deformation resins include resin compositions containing epoxy resin and the like, polyimide resin and silicone rubber.

In addition, in the case of an elastic deformation resin, differing from the resin composition according to the present embodiment, force response behavior is exhibited in which the area surrounded by the tensile stress-strain curve f1"(x) 31, the vertical line at X=0.3 and the x axis and the area surrounded by the tensile stress-strain curve f2"(x) 32, the vertical line at X=0.3 and the x axis are roughly equal. As shown in FIG. 1, the amount of change in the amount of strain when tensile stress is 0 before and after the application of tensile stress is 0.05% or less. On the basis thereof, a compact obtained from an elastic deformation resin is a material that deforms linearly corresponding to the applied stress. On the basis thereof, an effect is thought to be able to be exhibited in which the occurrence of warpage in the case of being bonded to another member due to deformation of the compact is adequately inhibited. In addition, in order for such a material to inhibit the occurrence of warpage, it is thought to be the result of enhancing the modulus of elasticity and lowering the coefficient of thermal expansion as previously described.

On the basis of the above, according to the resin composition according to the present embodiment, a compact obtained using this resin composition is thought to be able to adequately inhibit the occurrence of warpage even in the case of being bonded to another member. Examples of such compacts include printed wiring boards having a semiconductor chip bonded thereto, and according to the resin composition according to the present embodiment, a printed wiring board is obtained that is able to adequately inhibit the occurrence of package warpage.

In addition, each of the tensile stress-strain curves representing this force response behavior is preferably measured under the conditions indicated below.

First, the curve f1(x) is preferably measured by a measurement method in which the amount of strain is increased by pulling at 999 In addition, the curve f2(x) is preferably measured by a measurement method in which the amount of strain is reduced by decreasing tensile stress by pulling at 1 μm/min after having held the amount of strain at 0.3% for 1 minute. When the force response behavior of a cured product is measured under such conditions, since it is easy to determine whether or not a resin composition allows the obtaining of a compact in which the occurrence of stress is inhibited, a resin composition that allows the obtaining of a compact in which the occurrence of warpage is more effectively inhibited is considered to be obtained if the cured product satisfies the force response behavior described above under these measurement conditions. More specifically, even if the amount of strain is held at 0.3% for 1 minute, the amount of strain when tensile stress is 0 returns to the vicinity of 0% in the case of the resin composition according to the present embodiment. In contrast, in the case of the plastic deformation resin, the amount the cured product does not relax and return to its original shape is thought to increase as this holding time becomes longer.

The following indicates a measurement method as an example of a specific measurement method.

First, a cured product of a prescribed shape is molded for use as a measurement test piece using a resin composition. The shape of the cured product is such that it is only required to be compatible with the measuring instrument. Next, the f1(x) and f2(x) curves of the cured product are measured under the conditions described above using a tensile strength tester for the measuring instrument. An example of a tensile strength tester is a thermomechanical analyzer (TMA).

Next, a second proportion of a change in stress relative to a change in the amount of strain between a first amount of strain when stress is 0 and a second amount of strain resulting from adding 0.1% to the first amount of strain on curve f2(x) is preferably is as indicated below. Namely, the ratio of the second proportion to a first proportion, which is the proportion of a change in stress relative to a change in the amount of strain for an amount of strain of 0% to 0.1% on curve f1(x) (second proportion/first proportion), is preferably 0.5 or less and more preferably 0.1 to 0.5.

This first proportion is thought to be equivalent to the elastic modulus when a cured product begins to be formed as a result of pulling. In addition, the second proportion is thought to be equivalent to the elastic modulus immediately before deformation of the cured product completely returns to its original shape. Based on this relationship, the first proportion is thought to be larger than the second proportion, and the elastic modulus at the start of deformation is thought to be comparatively high. On the basis thereof, although the cured product deforms easily in the case of gradually applying stress, it is thought to tend to be resistant to deformation when stress is applied instantaneously. On the basis thereof, deformation that inhibits the occurrence of warpage is thought to occur easily, and use of the resin composition described above is thought to allow the obtaining of a compact in which the occurrence of warpage is more effectively inhibited.

In addition, the ratio of tensile stress on a stress-strain curve f2(0.15) to tensile stress on a tensile stress-strain curve f1(0.15) when the amount of strain is 0.15% [f2(0.15)/f1(0.15)] is preferably less than 0.9 and more preferably 0.1 to less than 0.9. In the case of such a ratio, in the case where stress is applied to a compact obtained using this resin composition, the compact is thought to exhibit performance in which deformation of the deformed compact returns slowly when returning to its original shape. Accordingly, a resin composition that satisfies this ratio is able to more effectively inhibit the occurrence of warpage.

In addition, a fourth proportion of a change in stress relative to a change in the amount of strain between an amount of strain of 0.2% and 0.3% on a tensile stress-strain curve f3(x) when the amount of strain is increased from 0% to 0.3% by pulling at 100 μm/min is preferably as indicated below. Namely, the ratio of the fourth proportion to a third proportion of a change in stress relative to a change in the amount of strain between an amount of strain of 0.2% and 0.3% on the curve f1(x) (fourth proportion/third proportion) is preferably 0.8 or less. Although this ratio is preferably as low as possible, in actuality, a value of about 0.01 is the limit. Consequently, the lower limit of this ratio is 0.01. Namely, the ratio of the fourth proportion to the third proportion (fourth proportion/third proportion) is preferably 0.01 to 0.8. In addition, this ratio is preferably as low as possible, and more specifically, it more preferably 0.01 to 0.6 and even more preferably 0.01 to 0.2. As a result, a compact obtained using this resin composition is subjected to little stress in the case of having been pulled comparatively slowly even in the case of a change in the amount of strain in which the amount of strain is between 0.2% and 0.3% that is near the end of a change from 0.2% to 0.3%. On the basis thereof, this compact is thought to be able to deform corresponding to a change in stress at which warpage occurs. Accordingly, a resin composition that satisfies this ratio is able to more effectively inhibit the occurrence of warpage.

In addition, a ratio of the minimum value of stress when the amount of strain has been maintained at 1% (maintained stress) to the maximum value of stress when pulled so that the amount of strain is 1% (tensile stress) (maintained stress/tensile stress) is preferably 0.05 to 0.95 and more preferably 0.1 to 0.95. On the basis thereof, when a compact obtained from the resin composition is maintained in a deformed state, even if the amount of strain does not change, the loaded stress is thought to gradually decrease. Accordingly, even in the case where deformation has occurred in response to a temperature change of the compact, stress that attempts to return that deformation to its original shape gradually weakens, and this is thought to make it possible to more effectively inhibit the occurrence of warpage. Accordingly, a resin composition that satisfies this ratio is able to more effectively inhibit the occurrence of warpage.

In addition, each of the force response behavior previously described preferably satisfies each of the above relationships even if pulling and relaxation is repeated two or more times. Namely, even if pulling when the amount of strain has been increased from 0% to 0.3% and its relaxation in the form of relaxing when the amount of strain is decreased from 0.3% are repeated two or more times, each of the above relationships is preferably satisfied. As a result of satisfying this relationship, additional dimensional changes caused by a change in temperature were determined to be able to be adequately accommodated. Accordingly, a resin composition that satisfies this relationship is able to more effectively inhibit the occurrence of warpage.

In addition, the resin composition according to the present embodiment preferably contains the components indicated below. For example, the resin composition is preferably a resin composition that contains epoxy resin, phenolic resin, imide resin, cyanate ester resin or vinyl ester resin.

In addition, examples of the resin composition include those containing a curable compound, a curing agent, a resin other than the curable compound and an inorganic filler.

The curable compound may be a low molecular weight component in the form of a resin that allows the obtaining of a cured product, or may be a resin that allows the obtaining of a cured product by increasing molecular weight or forming a network structure as a result of curing. More specifically, although there are no particular limitations thereon, examples of the curable compound include epoxy resin, phenolic resin, imide resin, cyanate ester resin, vinyl ester resin, urea resin, diallyl phthalate resin, melamine resin, guanamine resin, unsaturated polyester resin and melamine-urea co-condensed resin. One type of these may be used alone or two or more types may be used in combination. In addition, among the curable compounds listed above, the curable compound is preferably an epoxy resin, phenolic resin, imide resin, cyanate ester resin or vinyl ester resin. In this case, a compact is easily obtained that has the properties described above.

There are no particular limitations on the epoxy resin provided it is an epoxy resin that is used as a raw material of various types of boards able to be used in the production of laminated boards and circuit boards. More specifically, examples of epoxy resins include naphthalene epoxy resin, cresol novolac epoxy resin, bisphenol A epoxy resin, bisphenol F epoxy resin, bisphenol S epoxy resin, phenol novolac epoxy resin, alkyl phenolic novolac epoxy resin, aralkyl epoxy resin, biphenol epoxy resin, dicyclopentadiene epoxy resin, epoxy compounds of condensates of phenols and aromatic aldehydes having a phenolic hydroxyl group, triglycidyl isocyanurate and alicyclic epoxy resins. One type of these may be used alone or two or more types may be used in combination.

There are no particular limitations on the phenolic resin provided it is a phenolic resin that is used as a raw material of various types of boards able to be used in the production of laminated boards and circuit hoards. More specifically, examples of phenolic resins include phenolic novolac resin, cresol novolac resin, aromatic hydrocarbon-formaldehyde resin-modified phenolic resins, dicyclopentadiene-phenol adduct resins, phenol aralkyl resin, cresol aralkyl resin, naphthol aralkyl resin, biphenyl-modified phenol aralkyl resin, phenol trimethylolethane resin, tetraphenylol ethane resin, naphthol novolac resin, naphthol-phenol co-condensed novolac resin, naphthol-cresol co-condensed novolac resin, biphenyl-modified phenolic resin and aminotriazine-modified phenolic resin. One type of these may be used alone or two or more types may be used in combination.

There are no particular limitations on the imide resin provided it is an imide resin that is used as a raw material of various types of boards able to be used in the production of laminated boards and circuit boards. More specifically, examples of imide resins include polyamide-imide resins and polylmaleimide resins. Specific examples include imide resins obtained using phenylmethane maleimide, bisallyl nadimide, maleic acid N,N-ethylene bis-imide, maleic acid N,N-hexamethylene bis-imide, maleic acid N,N-metaphenylene bis-imide, maleic acid N,N-paraphenylene bis-imide, maleic acid N,N-4,4-diphenylmethane bis-imide, maleic acid N,N-4,4-diphenyl ether bis-imide, maleic acid N,N-4,4-diphenylsulfone bis-imide, maleic acid N,N-4,4-dicyclohexylmethane bis-imide, maleic acid N,N-α,α-4,4-dimethylenecyclohexane bis-imide, maleic acid N,N-4,4-metaxylylene bis-imide, and maleic acid N,N-4,4-diphenylcyclohexane bis-imide. One type of these may be used alone or two or more types may be used in combination.

There are no particular limitations on the cyanate ester resin provided it is a cyanate ester resin that is used as a raw material of various types of boards able to be used in the production of laminated boards and circuit boards. More specifically, examples of cyanate ester resins include cyanate ester resins obtained using bis(4-cyanatophenyl) ethane, 2,2-bis(4-cyanatophenyl)propane, 2,2-bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene and cyanato ester compounds of phenol-addition dicyclopentadiene polymers. One type of these may be used alone or two or more types may be used in combination.

There are no particular limitations on the vinyl ester resin provided it is a vinyl ester resin that is used as a raw material of various types of boards able to be used in the production of laminated boards and circuit boards. More specifically, examples of vinyl ester resins include resins obtained by reacting an unsaturated monobasic acid such as acrylic acid or methacrylic acid with a known epoxy resin.

In addition, there are no particular limitations on the curing agent provided it cures the curable compound, and examples thereof include known curing agents. Examples of curing agents include dicyandiamide, phenolic curing agents, acid anhydride-based curing agents, aminotriazine novolac-based curing agents and cyanate resin. In particular, in the case where the curable compound is an epoxy resin, phenolic curing agents such as a phenolic curing agent having a novolac backbone in the form of a novolac-based phenolic curing agent or a phenolic curing agent having a naphthalene backbone in the form of a naphthalene-based phenolic curing agent are used preferably. In addition, in the case where the curable compound is a cyanate ester resin, a curing agent of a metal-based reaction catalyst is used preferably. In addition, in the case where the curable compound is an imide resin, a curing agent (crosslinking agent) such as polyamine is used preferably.

In addition, examples of resins other than the curable compound include low-Tg resins having a glass transition temperature (Tg) of 100° C. or lower. Examples of these low-Tg resins include resins having a carbonyl group or siloxane group and epoxy group or phenolic hydroxyl group as functional groups in a molecule thereof. Namely, examples of these low-Tg resins include resins having a carbonyl group and an epoxy group, resins having a carbonyl group and a phenolic hydroxyl group, resins having a siloxane group and an epoxy group and resins having a siloxane group and a phenolic hydroxyl group, which have a Tg of 100° C. or lower. Furthermore, a siloxane group refers to a group having a siloxane bond (Si—O—Si). In addition, the low-Tg resin may be a resin that further has other functional groups in each of the four types of resins listed above. In addition, Tg of the low-Tg resin is preferably 100° C. or lower, more preferably 80° C. or lower and even more preferably 70° C. or lower. Here, Tg refers to the value obtained by measuring the resin alone with a differential scanning calorimeter (DSC).

In addition, this low-Tg resin is preferably a resin that has both a carbonyl group and epoxy group as functional groups in a molecule thereof. More specifically, the low-Tg resin preferably has repeating units represented by the following formula (I) and the following formula (II) and has an epoxy group. The repeating units represented by the following formula (I) and the following formula (II) can serve as, for example, the main chain of a molecule that composes the low-Tg resin. In addition, the epoxy group may be bound to the main chain, may be bound to a side chain or may be bound to the end of the main chain.

[C1]

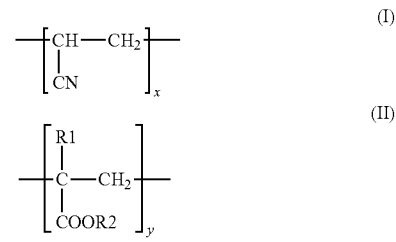

In addition, in the formula (I) and the formula (II), R1 represents H or CH$_3$. In addition, R2 represents H or an alkyl group.

In addition, in the repeating units represented by the formula (I) and the formula (II), the ratio of x to y is preferably such that x:y=0:1 to 0.35:0.65. On the basis thereof, a repeating unit represented by the formula (I) may not be contained in the low-Tg resin. In the case of having both the repeating units of the formula (I) and the formula (II), there are no particular limitations on the order of these sequences. In addition, the repeating unit represented by the formula (II) may contain a plurality of different types of repeating units (such as a plurality of repeating units in which R2 differs). In the case where R2 is an alkyl group in the repeating unit represented by the formula (II), there are no particular limitations on the number of carbon atoms thereof. The number of carbon atoms of the alkyl group can be, for example, 1 to 6. In addition, this alkyl group may be linear or branched. A specific example of a low-Tg resin having the above configuration is an epoxy-modified acrylic resin (acrylic resin having an epoxy group).

In addition, the low-Tg resin preferably has a siloxane group and a phenolic hydroxyl group. More specifically, the low-Tg resin preferably has repeating units represented by the following formula (III) and the following formula (IV) in a molecule thereof. Repeating units represented by the following formula (III) and the following formula (IV) can serve as the main chain of a molecule that composes the low-Tg resin. In addition, in the case where the low-Tg resin has the repeating units represented by the following formula (III) and the following formula (IV) in the main chain thereof, there are no particular limitations on the sequence order of these two types of repeating units.

[C2]

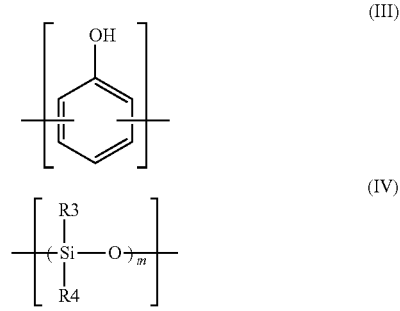

In addition, in the formula (IV), R3 and R4 respectively and independently represent H or a hydrocarbon group having 1 to 6 carbon atoms. In addition, m represents an integer of 1 or more.

A specific example of such a resin is a siloxane-modified phenolic resin, or in other words, a phenolic resin having a siloxane bond.

The weight average molecular weight (Mw) of the low-Tg resin is preferably 10,000 to 1,000,000 and more preferably 200,000 to 900,000. If the weight average molecular weight is within these ranges, a prepreg or metal-clad laminated board has favorable chemical resistance, and a prepreg having superior moldability is easily molded. Here, weight average molecular weight refers to, for example, the value measured as polystyrene by gel permeation chromatography.

In addition, there are no particular limitations on the organic filler. Examples of inorganic fillers include spherical silica, barium sulfate, silicon oxide powder, crushed silica, burnt talc, barium titanate, titanium oxide, clay, alumina, mica, boehmite, zinc borate, zinc stannate and other metal oxides and metal hydrates. Containing these inorganic fillers in a resin composition makes it possible to enhance dimensional stability of a laminated board.

In addition, the resin composition may also contain components in addition to those described above. For example, the resin composition may contain a curing accelerator. There are no particular limitations on the curing accelerator. Examples of curing accelerators that can be used include imidazole and derivatives thereof, organic phosphorous compounds, metal soaps such as zinc octanoate, secondary amines, tertiary amines and quaternary amines. The resin composition may also contain a photostabilizer, viscosity adjuster or flame retardant and the like.

In addition, in the resin composition, the weight ratio between the total amount of the curable compound and the curing agent and resin other than the curable compound is preferably, for example, 90:10 to 50:50. In addition, in the curable compound and the curing agent the equivalence ratio between an epoxy resin and phenolic curing agent is preferably, for example, 0.8:1.2 to 1.2:0.8. Moreover, the content of the inorganic filler is preferably 80% by weight or less based on the total weight of the resin composition.

In addition, the respective mixing ratio of each component when preparing the resin composition can be suitably adjusted. For example, each component can be mixed so that the content of the curable compound is 10% by weight to 40% by weight, the content of resin other than the curable compound is 5% by weight to 40% by weight, and the content of inorganic filler is 20% by weight to 80% by weight.

In addition, when producing a prepreg, the resin composition according to the present embodiment is used by preparing in the form of a varnish for the purpose of impregnating a base material for forming the prepreg (fibrous base material). The resin composition according to the present embodiment can be prepared in the form of a varnish (resin varnish). Namely, the resin varnish according to the present embodiment contains the resin composition and a solvent. This resin varnish allows the obtaining of a compact that adequately inhibits the occurrence of warpage. A prepreg obtained by using this resin varnish can be used to produce a compact such as a printed wiring board that adequately inhibits the occurrence of warpage. In addition, this resin varnish can be prepared, for example, in the manner described below.

First, each component of the resin composition that can be dissolved in an organic solvent is added to an organic solvent and dissolved therein. At this time, the organic solvent may be heated as necessary. Subsequently, components used as necessary that do not dissolve in the organic solvent, such as the inorganic filler, are added, and the resin composition is prepared in the form of a varnish by dispersing to a prescribed dispersed state using a ball mill, bead mill, planetary mixer or roll mill and the like. There are no particular limitations on the organic solvent used here. Specific examples thereof include ketone-based solvents such as acetone, methyl ethyl ketone or cyclohexanone, aromatic solvents such as toluene or xylene, and nitrogen-containing organic solvents such as dimethylformamide.

An example of a method used to produce a prepreg using the resulting resin varnish consists of impregnating a fibrous base material with the resulting resin varnish followed by drying. Namely, the prepreg according to the present embodiment is obtained by impregnating a fibrous base material with the resin varnish. The resulting prepreg can be used to produce a compact such as a printed wiring board that adequately inhibits the occurrence of warpage.

Specific examples of fibrous base materials used when producing the prepreg include glass cloth, aramid cloth, polyester cloth, non-woven glass fabric, non-woven aramid fabric, non-woven polyester fabric, pulp paper and linter paper. Furthermore, the use of glass cloth allows the obtaining of a laminated board having superior mechanical strength, and glass cloth that has undergone leveling treatment is particularly preferable. More specifically, leveling treatment can be carried out by, for example, continuously pressing the glass cloth with a press roll at a suitable pressure to compress the yarn until it is flat. Furthermore, a thickness of, for example, 10 μm to 200 μm can be used for the thickness of the fibrous base material.

Impregnation of the fibrous base material with the resin varnish is carried out by immersion or coating and the like. This impregnation can be repeated a plurality of times as necessary. In addition, at this time, the composition and resin content can be adjusted as desired by repeating impregnation using a plurality of resin varnishes having different compositions and concentrations.

A semi-hard (B stage) prepreg is obtained by heating the fibrous base material impregnated with the resin varnish under desired heating conditions such as by heating for 3 minutes to 15 minutes at 120° C. to 190° C.

A method for fabricating a metal-clad laminated board using a prepreg obtained in this manner consists of using a single prepreg or layering a plurality of prepregs, layering a metal foil such as copper foil on both the upper and lower sides or one side thereof, and laminating this by hot press molding to fabricate a laminate clad with metal foil on both sides or one side. Namely, the metal-clad laminated board according to the present embodiment is obtained by laminating a metal foil on the prepreg followed by hot press molding. This metal-clad laminated board can be used to produce a printed wiring board that adequately inhibits the occurrence of warpage.

By forming a circuit in the surface of the fabricated laminate such as by etching the metal foil, a printed wiring board can be obtained provided with a circuit in the form of a conductor pattern on the surface of the laminate. Namely, the printed wiring board according to the present embodiment is produced using the prepreg. This printed wiring board is able to adequately inhibit the occurrence of warpage even when in the form of a package having a semiconductor chip bonded thereto.

Although the present description discloses various aspects of technology as previously described, the primary technology thereof is summarized below.

In the resin composition according to one aspect of the present invention, a cured product obtained by curing this resin composition first exhibits force response behavior such that the area surrounded by the following tensile stress-strain curve f1(x), the vertical line at X=0.3 and the x axis is greater than the area surrounded by the following tensile stress-strain curve f2(x), the vertical line at X=0.3 and the x axis. Furthermore, the tensile stress-strain curve f1(x) described here has the amount of strain plotted on the x axis, tensile stress plotted on the y axis, and is a tensile stress-strain curve when the amount of strain by pulling at 999 µm/min is increased from 0% to 0.3%. Moreover, the tensile stress-strain curve f2(x) is a tensile strain-strain curve when the amount of strain is decreased from 0.3% to the strain amount at tensile stress of 0%. In addition, the cured product exhibits force response behavior such that the amount of change in the amount of strain when tensile stress is 0 before and after applying tensile stress is 0.05% or less.

According to this configuration, a resin composition can be provided that allows the obtaining of a compact that adequately inhibits the occurrence of stress even in the case of being bonded to another member. For example, a resin composition can be provided that allows the obtaining of a printed wiring board bonded to a semiconductor chip that is able to adequately inhibit the occurrence of package warpage. In addition, this resin composition can be used to produce an insulating film that inhibits the occurrence of warpage even if a member of a different material is bonded thereto in addition to the printed wiring board bonded to a semiconductor chip.

Since a resin composition from which is obtained a cured product as described above allows a compact obtained using the resin composition per se to deform corresponding to a dimensional change caused by a change in temperature even if another member is bonded to the compact, the occurrence of warpage is thought to be adequately inhibited. In addition, since the amount of change in the amount of strain when tensile stress is 0 is small as previously described, additional dimensional changes caused by a change in temperature are thought to be able to be adequately accommodated. On the basis thereof, the resin composition is thought to allow the obtaining of a compact that adequately inhibits the occurrence of warpage.

In addition, in the resin composition, the cured product is preferably such that the ratio of a second proportion on the curve f2(x) to a first proportion on the curve f1(x) is 0.5 or less. Furthermore, the first proportion is the proportion of a change in stress relative to a change in the amount of strain at an amount of strain of 0% to 0.1% on the curve f1(x). In addition, the second proportion is the proportion of a change in stress relative to a change in the amount of strain between a first amount of strain when stress is 0 and a second amount of strain resulting from adding 0.1% to the first amount of strain on the curve f2(x).

According to this configuration, a resin composition can be provided that allows the obtaining of a compact in which the occurrence of stress has been more effectively inhibited.

The first proportion is thought to be equivalent to the elastic modulus when a cured product begins to be formed as a result of pulling. In addition, the second proportion is thought to be equivalent to the elastic modulus immediately before deformation of the cured product completely returns to its original shape. Based on this relationship, the first proportion is thought to be larger than the second proportion, and the elastic modulus at the start of deformation is thought to be comparatively high. On the basis thereof, although the cured product deforms easily in the case of gradually applying stress, it is thought to tend to be resistant to deformation when stress is applied instantaneously. On the basis thereof, deformation that inhibits the occurrence of warpage is thought to occur easily, and use of this resin composition is thought to allow the obtaining of a compact in which the occurrence of warpage is more effectively inhibited.

In addition, in the resin composition, the cured product is such that the ratio of tensile stress on a stress-strain curve f2(0.15) to tensile stress on a tensile stress-strain curve f1(0.15) when the amount of strain is 0.15% is preferably less than 0.9.

According to this configuration, a resin composition can be provided that allows the obtaining of a compact in which the occurrence of warpage is more effectively inhibited.

In addition, in the resin composition, the curve f1(x) is preferably such that the amount of strain is increased by pulling at 999 µm/min as previously described, and the curve f2(x) is preferably such that the amount of strain is reduced by decreasing tensile stress by pulling at 1 µm/min after having held the amount of strain at 0.3% for 1 minute.

According to this configuration, a resin composition can be provided that allows the obtaining of a compact in which the occurrence of stress is more effectively inhibited. This means that, when the force response behavior of a cured product is measured under such conditions, since it is easy to determine whether or not a resin composition allows the obtaining of a compact in which the occurrence of stress is inhibited, a resin composition that allows the obtaining of a compact in which the occurrence of warpage is more effectively inhibited is considered to be obtained if the cured product satisfies the force response behavior described above under these measurement conditions.

In addition, in the resin composition, the cured product is such that the ratio of the fourth proportion to the third proportion on the curve f1(x) is preferably 0.8 or less. Here, the third proportion is the proportion of a change in stress relative to a change in the amount of strain between an amount of strain of 0.2% and 0.3% on the curve f1(x). In addition, the fourth proportion is the proportion of a change in stress relative to a change in the amount of strain between an amount of strain of 0.2% and 0.3% on a tensile stress-strain curve f3(x) when the amount of strain is increased from 0% to 0.3% by pulling at 100 µm/min.

According to this configuration, a resin composition can be provided that allows the obtaining of a compact in which the occurrence of warpage is more effectively inhibited.

In addition, in the resin composition, the cured product is such that the ratio of the minimum value of stress when the amount of strain has been maintained at 1% to the maximum value of stress when pulled so that the amount of strain is 1% is preferably 0.05 to 0.95.

According to this configuration, a resin composition can be provided that allows the obtaining of a compact in which the occurrence of warpage is more effectively inhibited. On the basis thereof, when a compact obtained from the resin composition is maintained in a deformed state, even if the amount of strain does not change, the loaded stress is thought to gradually decrease. Accordingly, even in the case where deformation has occurred in response to a temperature change of the compact, stress that attempts to return that deformation to its original shape gradually weakens, and this is thought to make it possible to more effectively inhibit the occurrence of warpage.

In addition, in the resin composition, the stress response behavior is preferably stress response behavior in which increases and decreases in the amount of strain are repeated two or more times.

According to this configuration, a resin composition can be provided that allows the obtaining of a compact in which the occurrence of stress is more effectively inhibited. On the basis thereof, additional dimensional changes caused by a change in temperature can be adequately accommodated.

In addition, the resin composition preferably contains at least one type selected from the group consisting of epoxy resin, phenolic resin, imide resin, cyanate ester resin and vinyl ester resin.

According to this configuration, a resin composition can be provided that allows the obtaining of a compact in which the occurrence of stress is more effectively inhibited.

In addition, the resin varnish according to another aspect of the present invention contains the resin composition and a solvent.

According to this configuration, a resin varnish can be provided that allows the obtaining of a compact in which the occurrence of stress is more adequately inhibited. A prepreg obtained using this resin varnish can be used to produce a compact such as a printed circuit board in which the occurrence of warpage is adequately inhibited.

In addition, the prepreg according to another aspect of the present invention is obtained by impregnating a fibrous base material with the resin varnish.

According to this configuration, a prepreg can be provided that can be used to produce a compact such as a printed wiring board in which the occurrence of warpage is adequately inhibited.

In addition, the metal-clad laminated board according to another aspect of the present invention is obtained by laminating a metal foil onto the prepreg followed by hot press molding.

According to this configuration, a metal-clad laminated board can be provided that can be used to produce a printed wiring board in which the occurrence of warpage is adequately inhibited.

In addition, the printed wiring board according to another aspect of the present invention is produced by using the prepreg.

According to this configuration, a printed wiring board can be provided that is able to adequately inhibit the occurrence of warpage even when in the form of a package having a semiconductor chip bonded thereto.

Although the following provides a more detailed explanation of the present invention through examples thereof, the scope of the present invention is not limited thereto.

EXAMPLES

Example 1

A resin composition having the composition indicated below was used.

A resin composition was obtained by blending 48.06 parts by weight of naphthalene epoxy resin (HP9500, DIC Corporation). 21.94 parts by weight of novolac-based phenolic curing agent (TD2090, DIC Corporation), 30 parts by weight of epoxy-modified acrylic resin (SG-P3, Nagase Chemtex Corporation), 0.05 parts by weight of a curing accelerator in the form of imidazole (2E4MZ: 2-ethyl-4-methylimidazole, SHIKOKU CHEMICALS CORPORATION) and 50 parts by weight of spherical silica (SC2500-GFL, Admatechs Company Limited).

Furthermore, the epoxy-modified acrylic resin (SG-P3, Nagase Chemtex Corporation) is a resin that has repeating units represented by the formula (I) and the formula (II), wherein R1 represents a hydrogen atom and R2 represents a butyl group or ethyl group in formula (II), and has an epoxy group, in a molecule thereof. In addition, the epoxy-modified acrylic resin (SG-P3, Nagase Chemtex Corporation) has a weight average molecular weight (Mw) of 850,000, an epoxy value of 0.2 eq/kg and a Tg of 12° C.

Moreover, this resin composition was diluted with a solvent in the form of methyl ethyl ketone (MEK) to obtain a resin composition in the form of a varnish (resin varnish).

A compact measuring 3 mm wide, 20 mm long and 0.06 mm thick was fabricated using the resulting resin varnish.

The force response behavior of the compact was measured using a thermomechanical analyzer (TMA/SS7100, Hitachi High-Tech Science Corporation). More specifically, a tensile stress-strain curve f1(x) was measured when the amount of strain was increased from 0% to 0.3% by pulling at 999 μm/min while plotting the amount of strain on the x axis and tensile stress on the y axis. Subsequently, a tensile stress-strain curve f2(x) was measured when the amount of strain was reduced from 0.3% by decreasing tensile stress by pulling at 1 μm/min after having held the amount of strain at 0.3% for 1 minute. In addition, separate from the above, a tensile stress-strain curve f3(x) was measured when the amount of strain was increased from 0% to 0.3% by pulling at 100 μm/min.

The area surrounded by f1(x) and the x axis was greater than the area surrounded by f2(x) and the x axis. In addition, the amount of change in the amount of strain when tensile stress was 0 before and after applying tensile stress was 0.005%. In addition, tensile stress for f1(0.15) was 84.7 mN/mm$^2$ and tensile stress for f2(0.15) was 39.1 mN/mm$^2$. The ratio of f2(0.15)/f1(0.15) was about 0.46. The ratio of the second proportion/first proportion was about 0.25. The ratio of the fourth proportion/third proportion was about 0.17. In addition, the ratio of maintained stress/tensile stress was about 0.3.

A semiconductor chip was bonded to the board obtained using the resin varnish, the gap between the board and semiconductor chip was solidified with an underfill material, and the resulting test piece was used to evaluate warpage. Furthermore, the board contained in this test piece is considered to be equivalent to a printed wiring board in which only a circuit formed with copper foil and the like is not formed. On the basis thereof, warpage of this test piece was considered to be equivalent to warpage of a package in which a semiconductor chip is bonded to a printed wiring board.

The amount of warpage of this fabricated test piece at 25° C. was measured by placing the test piece on a smooth surface and measuring the maximum value of the distance between the smooth surface and the lower end surface of the test piece. As a result, the amount of warpage of the test piece at 25° C. was 102 μm.

Next, the amount of warpage induced by a temperature change from 25° C. to 260° C. was measured. More specifically, the amount warpage of the test piece at 260° C. was measured in the same manner as in the case of measuring at 25° C. as described above with the exception of changing the temperature. The sum of the amount of warpage of the test piece at 260° C. and the amount of warpage of the test piece at 25° C. was taken to be the amount of warpage caused by a temperature change from 25° C. to 260° C. As a result, the amount of warpage caused by this temperature change was 285 μm.

Example 2

Example 2 was carried out in the same manner as Example 1 with the exception of using a resin composition having the composition indicated below.

A resin composition was obtained by blending 38.59 parts by weight of naphthalene epoxy resin (HP9500, DIC Corporation), 15.35 parts by weight of novolac-based phenolic curing agent (TD2090, DIC Corporation), 46.06 parts by weight of siloxane-modified phenolic resin (GPI-LM, Gun Ei Chemical Industry Co., Ltd.), 0.05 parts by weight of a curing accelerator in the form of imidazole (2E4MZ: 2-ethyl-4-methylimidazole, SHIKOKU CHEMICALS CORPORATION) and 50 parts by weight of spherical silica (SC2500-GFL, Admatechs Company Limited).

Furthermore, the siloxane-modified phenolic resin (GPI-LM, Gun Ei Chemical Industry Co., Ltd.) is a resin that has repeating units represented by the formula (III) and the formula (IV), wherein R3 represents a hydrogen atom or hydrocarbon group having 1 to 6 carbon atoms and R4 represents a hydrogen atom or hydrocarbon group having 1 to 6 carbon atoms in formula (IV). In addition, the siloxane-modified phenolic resin (GPI-LM, Gun Ei Chemical Industry Co., Ltd.) has a weight average molecular weight (Mw) of 47,000 and a Tg of 55° C.

Moreover, this resin composition was diluted with a solvent in the form of methyl ethyl ketone (MEK) to obtain a resin composition in the form of a varnish (resin varnish).

The force response behavior of a compact was measured using the resulting resin varnish according to the same method as that of Example 1.

The area surrounded by f1(x) and the x axis was greater than the area surrounded by f2(x) and the x axis. In addition, the amount of change in the amount of strain when tensile stress was 0 before and after applying tensile stress was 0.03%. In addition, tensile stress for f1(0.15) was 143.6 mN/mm$^2$ and tensile stress for f2(0.15) was 37.5 mN/mm$^2$. The ratio of f2(0.15)/f1(0.15) was about 0.26. The ratio of the second proportion/first proportion was about 0.39. The ratio of the fourth proportion/third proportion was about 0.59. In addition, the ratio of maintained stress/tensile stress was about 0.93.

A test piece was fabricated using this resin composition according to the same method as Example 1 followed by measurement of the amount of warpage thereof.

The amount of warpage of the fabricated test piece at 25° C. was 106 μm. The amount of warpage caused by a temperature change from 25° C. to 260° C. was 226 μm.

Example 3

Example 3 was carried out in the same manner as Example 1 with the exception of using a resin composition having the composition indicated below.

A resin composition was obtained by blending 30 parts by weight of epoxy-modified acrylic resin (SG-P3, Nagase Chemtex Corporation), 35 parts by weight of imide resin (BMI-2300, Daiwakasei Co., Ltd.), 35 parts by weight of imide resin (MANI-M, Maruzen Petrochemical Co., Ltd.), 0.05 parts by weight of a curing accelerator in the form of imidazole (2E4MZ: 2-ethyl-4-methylimidazole, SHIKOKU CHEMICALS CORPORATION) and 50 parts by weight of spherical silica (SC2500-GFL, Admatechs Company Limited).

Furthermore, this resin composition was diluted with a solvent in the form of methyl ethyl ketone (MEK) to obtain a resin composition in the form of a varnish (resin varnish).

The force response behavior of a compact was measured using the resulting resin varnish according to the same method as that of Example 1.

The area surrounded by f1(x) and the x axis was greater than the area surrounded by f2(x) and the x axis. In addition, the amount of change in the amount of strain when tensile stress was 0 before and after applying tensile stress was 0.01%. In addition, tensile stress for f1(0.15) was 400.7 mN/mm$^2$ and tensile stress for f2(0.15) was 198.2 mN/mm$^2$. The ratio of f2(0.15)/f1(0.15) was about 0.49. The ratio of the second proportion/first proportion was about 0.29. The ratio of the fourth proportion/third proportion was about 0.62. In addition, the ratio of maintained stress/tensile stress was about 0.82.

A test piece was fabricated using this resin composition according to the same method as Example 1 followed by measurement of the amount of warpage thereof.

The amount of warpage of the test piece at 25° C. was 235 μm. The amount of warpage caused by a temperature change from 25° C. to 260° C. was 420 μm.

Example 4

Example 4 was carried out in the same manner as Example 1 with the exception of using a resin composition having the composition indicated below.

A resin composition was obtained by blending 49 parts by weight of naphthalene epoxy resin (HP9500, DIC Corporation), 30 parts by weight of epoxy-modified acrylic resin (SG-P3-Mw1, Nagase Chemtex Corporation), 21 parts by weight of cyanate ester resin (BADCy, Lonza Japan, Ltd.), 0.02 parts by weight of a curing accelerator in the form of zinc octanoate (DIC Corporation), and 150 parts by weight of spherical silica (SC2500-GFL, Admatechs Company Limited).

Furthermore, the epoxy-modified acrylic resin (SG-P3-Mw1, Nagase Chemtex Corporation) is a resin that has repeating units represented by the formula (I) and the formula (II), wherein R1 represents a hydrogen atom and R2 represents a butyl group or ethyl group in formula (II), and has an epoxy group, in a molecule thereof. In addition, the epoxy-modified acrylic resin (SG-P3-Mw1, Nagase Chemtex Corporation) has a weight average molecular weight (Mw) of 260,000, an epoxy value of 0.2 eq/kg, and a Tg of 12° C.

Moreover, this resin composition was diluted with a solvent in the form of methyl ethyl ketone (MEK) to obtain a resin composition in the form of a varnish (resin varnish).

The force response behavior of a compact was measured using the resulting resin varnish according to the same method as that of Example 1.

The area surrounded by f1(x) and the x axis was greater than the area surrounded by f2(x) and the x axis. In addition, the amount of change in the amount of strain when tensile stress was 0 before and after applying tensile stress was 0.009%. In addition, tensile stress for f1(0.15) was 297.1 mN/mm$^2$ and tensile stress for f2(0.15) was 150.5 mN/mm$^2$. The ratio of f2(0.15)/f1(0.15) was about 0.51. The ratio of the second proportion/first proportion was about 0.28. The ratio of the fourth proportion/third proportion was about 0.65. In addition, the ratio of maintained stress/tensile stress was about 0.87.

A test piece was fabricated using this resin composition according to the same method as Example 1 followed by measurement of the amount of warpage thereof.

The amount of warpage of the test piece at 25° C. was 229 μm. The amount of warpage caused by a temperature change from 25° C. to 260° C. was 417 μm.

Comparative Example 1

Comparative Example 1 was carried out in the same manner as Example 1 with the exception of using a resin composition having the composition indicated below.

A resin composition was obtained by blending 48.06 parts by weight of naphthalene epoxy resin (HP9500, DIC Corporation), 21.94 parts by weight of novolac-based phenolic curing agent (TD2090, DIC Corporation), 30 parts by weight of epoxy-modified acrylic resin (SG-P3-Mw1, Nagase Chemtex Corporation), 0.05 parts by weight of a curing accelerator in the form of imidazole (2E4MZ: 2-ethyl-4-methylimidazole, SHIKOKU CHEMICALS CORPORATION), and 250 parts by weight of spherical silica (SC2500-GFL, Admatechs Company Limited).

Furthermore, the epoxy-modified acrylic resin (SG-P3-Mw1, Nagase Chemtex Corporation) is a resin that has repeating units represented by the formula (I) and the formula (II), wherein R1 represents a hydrogen atom and R2 represents a butyl group or ethyl group in formula (II), and has an epoxy group, in a molecule thereof. In addition, the epoxy-modified acrylic resin (SG-P3-Mw1, Nagase Chemtex Corporation) has a weight average molecular weight (Mw) of 260,000, an epoxy value of 0.2 eq/kg, and a Tg of 12° C.

Moreover, this resin composition was diluted with a solvent in the form of methyl ethyl ketone (MEK) to obtain a resin composition in the form of a varnish (resin varnish).

The force response behavior of a compact was measured using the resulting resin varnish according to the same method as that of Example 1.

The area surrounded by f1(x) and the x axis was roughly equal to the area surrounded by f2(x) and the x axis. On the basis thereof, this resin varnish was determined to have an elastic deformation resin as the main component thereof. In addition, the amount of change in the amount of strain when tensile stress was 0 before and after applying tensile stress was 0.005%. In addition, tensile stress for f1(0.15) was 72.5 mN/mm$^2$ and tensile stress for f2(0.15) was 68.9 mN/mm$^2$. The ratio of f2(0.15)/f1(0.15) was about 0.95. The ratio of the second proportion/first proportion was about 1.0. The ratio of the fourth proportion/third proportion was about 0.93. In addition, the ratio of maintained stress/tensile stress was about 1.0.

A test piece was fabricated using this resin composition according to the same method as Example 1 followed by measurement of the amount of warpage thereof.

The amount of warpage of the test piece at 25° C. was 388 μm. The amount of warpage caused by a temperature change from 25° C. to 260° C. was 878 μm.

Comparative Example 2

A compact measuring 3 mm wide, 20 mm long and 0.06 mm thick was fabricated in the same manner as Example 1 using a solution obtained by dissolving a polyamide-imide resin (HR16NN, TOYOBO CO., LTD.) in MEK. In the use of this compact, the force response behavior of the compact was then measured according to the same method as Example 1.

The area surrounded by f1(x) and the x axis was roughly equal to the area surrounded by f2(x) and the x axis. On the basis thereof, the polyamide-imide resin was determined to be an elastic deformation resin. In addition, the amount of change in the amount of strain when tensile stress was 0 before and after applying tensile stress was 0.002%. In addition, tensile stress for f1(0.15) was 316.8 mN/mm$^2$ and tensile stress for f2(0.15) was 310.2 mN/mm$^2$. The ratio of f2(0.15)/f1(0.15) was about 0.98. The ratio of the second proportion/first proportion was about 1.0. The ratio of the fourth proportion/third proportion was about 0.95. In addition, the ratio of maintained stress/tensile stress was about 1.0.

The solution as described above was coated onto copper foil and dried for 5 minutes at 250° C. followed by removing the copper foil and using the resulting board to fabricate a test piece having a semiconductor chip bonded thereto. The amount of warpage of this test piece was then measured according to the same method as Example 1.

The amount of warpage of the test piece at 25° C. was 411 μm. The amount of warpage caused by a temperature change from 25° C. to 260° C. was 835 μm.

Comparative Example 3

Instead of using a compact obtained by using the resin varnish in Example 1, a film having silicone rubber as the main component thereof (0.05 mm thick silicone sheet, Togawa Rubber Company Limited) was cut out to a width of 3 mm, length of 20 mm and thickness of 0.05 mm. Force response behavior was measured using this cut out film according to the same method as Example 1.

The area surrounded by f1(x) and the x axis was roughly equal to the area surrounded by f2(x) and the x axis. On the basis thereof, the measured film was determined to have an elastic deformation resin as the main component thereof. In addition, the amount of change in the amount of strain when tensile stress was 0 before and after applying tensile stress was 0.001%. In addition, tensile stress for f1(0.15) was 36.1 mN/mm$^2$ and tensile stress for f2(0.15) was 34.7 mN/mm$^2$. The ratio of f2(0.15)/f1(0.15) was about 0.96. The ratio of the second proportion/first proportion was about 1.0. The ratio of the fourth proportion/third proportion was about 0.96. In addition, the ratio of maintained stress/tensile stress was about 1.0.

The film as described above was used as a board to fabricate a test piece having a semiconductor chip bonded thereto. The amount of warpage of the test piece was then measured according to the same method as Example 1.

The amount of warpage of the test piece at 25° C. was 330 µm. The amount of warpage caused by a temperature change from 25° C. to 260° C. was 785 µm.

Comparative Example 4

Comparative Example 4 was carried out in the same manner as Example 1 with the exception of using a resin composition having the composition indicated below.

Instead of using a compact obtained using the resin varnish in Example 1, a film having polyethylene as the main component thereof (commercially available product) was cut out to a width of 3 mm, length of 20 mm and thickness of 0.05 mm. Force response behavior was measured using this cut out film according to the same method as Example 1.

Moreover, this resin composition was diluted with a solvent in the form of methyl ethyl ketone (MEK) to obtain a resin composition in the form of a varnish (resin varnish).

The force response behavior of a compact was measured using the resulting resin varnish according to the same method as Example 1.

The area surrounded by f1(x) and the x axis was greater than area surrounded by f2(x) and the x axis. In addition, the amount of change in the amount of strain when tensile stress was 0 before and after applying tensile stress was 0.10%. In addition, tensile stress for f1(0.15) was 110.3 mN/mm² and tensile stress for f2(0.15) was 47.0 mN/mm². The ratio of tensile stress of f2(0.15)/f1(0.15) was about 0.43. The ratio of the second proportion/first proportion was about 0.9. The ratio of the fourth proportion/third proportion was about 0.86. In addition, the ratio of maintained stress/tensile stress was about 0.6.

A test piece was fabricated using this resin composition according to the same method as Example 1 followed by measurement of the amount of warpage thereof.

Since the test piece deformed considerably at high temperatures, accurate values relating to the amount of warpage were unable to be measured.

Comparative Example 5

Instead of using a compact obtained using the resin varnish in Example 1, a film having polyethylene naphthalate as the main component thereof (Teonex, Teijin DuPont Films Japan Limited) was cut out to a width of 3 mm, length of 20 mm and thickness of 0.05 mm. Force response behavior was measured using this cut out film according to the same method as Example 1.

The area surrounded by f1(x) and the x axis was greater than the area surrounded by f2(x) and the x axis. In addition, the amount of change in the amount of strain when tensile stress was 0 before and after applying tensile stress was comparatively large at 0.07%. On the basis thereof, the test film was determined to have a plastic deformation resin as the main component thereof. In addition, tensile stress for f1(0.15) was 161.8 mN/mm² and tensile stress for f2(0.15) was 142.3 mN/mm². The ratio of f2(0.15)/f1(0.15) was about 0.88. The ratio of the second proportion/first proportion was about 0.8. The ratio of the fourth proportion/third proportion was about 0.90. In addition, the ratio of maintained stress/tensile stress was about 0.85.

The film as described above was used as a board to fabricate a test piece having a semiconductor chip bonded thereto. The amount of warpage of the test piece was then measured according to the same method as Example 1.

The amount of warpage of the test piece at 25° C. was 473 µm. The amount of warpage caused by a temperature change from 25° C. to 260° C. was 530 µm.

The above results are summarized in the following Table 1.

TABLE 1

| | | Ex. 1 | Ex. 2 | Ex. 3 | Ex. 4 | Comp. Ex. 1 | Comp. Ex. 2 | Comp. Ex. 3 | Comp. Ex. 4 | Comp. Ex. 5 |
|---|---|---|---|---|---|---|---|---|---|---|
| Resin | Naphthalene epoxy resin | 48.06 | 38.59 | | 49 | 48.06 | | | | |
| | Novolac-based phenolic curing agent | 21.94 | 15.35 | | | 21.94 | | | | |
| | Naphthalene-based phenolic curing agent | | | | | | | | | |
| | Epoxy-modified acrylic resin (Mw: 260,000. 0.2 eq/kg) | | | | 30 | 30 | | | | |
| | Epoxy-modified acrylic resin (Mw: 850,000. 0.2 eq/kg) | 30 | | 30 | | | | | | |
| | Siloxane-modified phenolic resin | | 46.06 | | | | | | | |
| | Imide resin 1 | | | 35 | | | | | | |
| | Imide resin 2 | | | 35 | | | | | | |
| | Cyanate ester resin | | | | 21 | | | | | |
| | Polyamide-imide 50 µm | | | | | | 100 | | | |
| | Silicone rubber 50 µm | | | | | | | 100 | | |
| | Polyethylene 50 µm | | | | | | | | 100 | |
| | Polyethylene naphthalate 50 µm | | | | | | | | | 100 |
| Curing accelerator (imidazole) | | 0.05 | 0.05 | 0.05 | | 0.05 | | | | |
| Curing accelerator (tin octanoate) | | | | | 0.02 | | | | | |
| Filler | Spherical silica | 50 | 50 | 50 | 150 | 250 | | | | |
| Total (parts by weight) | | 150.05 | 150.05 | 150.05 | 250.02 | 350.05 | 100 | 100 | 100 | 100 |
| f1(0.15) mN/mm² | | 84.7 | 143.6 | 400.7 | 297.1 | 72.5 | 316.8 | 36.1 | 110.3 | 161.8 |
| f2(0.15) mN/mm² | | 39.1 | 37.5 | 198.2 | 150.5 | 68.9 | 310.2 | 34.7 | 47.0 | 142.3 |
| f2(0.15)/f1(0.15) | | 0.46 | 0.26 | 0.49 | 0.51 | 0.95 | 0.98 | 0.96 | 0.43 | 0.88 |
| 2nd proportion/1st proportion | | 0.25 | 0.39 | 0.29 | 0.28 | 1.00 | 1.00 | 1.00 | 0.90 | 0.80 |
| 4th proportion/3rd proportion | | 0.17 | 0.59 | 0.62 | 0.65 | 0.93 | 0.95 | 0.96 | 0.86 | 0.90 |
| Maintained stress/tensile stress | | 0.3 | 0.93 | 0.82 | 0.87 | 1.0 | 1.0 | 1.0 | 0.6 | 0.85 |
| Warpage (25° C.) µm | | 102 | 106 | 235 | 229 | 388 | 411 | 330 | — | 473 |
| Amount of change in warpage (25° C.-260° C.) µm | | 285 | 226 | 420 | 417 | 878 | 835 | 785 | — | 530 |

On the basis of these results, in the case of fabricating a package using a resin composition that allows the obtaining of a cured product that exhibits force response behavior in which the first area is greater than the second area and the amount of change in the amount of strain when tensile stress is 0 before and after applying tensile stress is 0.05% or less (Examples 1 to 4), the occurrence of warpage was determined to be able to be adequately inhibited in comparison with the case of using an elastic deformation resin (Comparative Examples 1 to 3) or in the case of using a plastic deformation resin (Comparative Examples 4 and 5).

Moreover, the occurrence of warpage in Examples 1 and 2 was extremely low in comparison with that of Examples 3 and 4, and this is thought to be due to the low amount of stress generated in Examples 1 and 2 in comparison with Examples 3 and 4.

On the basis of the above, a resin composition that allows the obtaining of a cured product that exhibits force response behavior in which the first area is greater than the second area and the amount of change in the amount of strain when tensile stress is 0 before and after applying tensile stress is 0.05% or less was determined to be a resin composition that allows the obtaining of a compact in which the occurrence of warpage is adequately inhibited even in the case of being bonded to another member.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. A prepreg consisting of a fibrous base material and a resin composition varnish wherein the resin composition comprises
    at least one curable resin selected from the group consisting of epoxy resin, phenolic resin, imide resin, cyanate ester resin, vinyl ester resin, urea resin, diallyl phthalate resin, melamine resin, guanamine resin, unsaturated polyester resin, and melamine-urea co-condensed resin;
    a curing agent,
    a second resin having
        a carbonyl group or a siloxane group, and
        an epoxy group or a phenolic hydroxyl group as a functional group in a molecule thereof,
    an inorganic filler, and
    a solvent;
    wherein the resin composition becomes a cured product that exhibits force response behavior such that an area surrounded by a tensile stress-strain curve $f1(x)$, when an amount of strain is increased from 0% to 0.3% by pulling at 999 μm/min while plotting the amount of strain on the x axis and tensile stress on the y axis, and also surrounded by the x axis, is greater than an area surrounded by a stress-strain curve $f2(x)$, when the amount of strain is decreased from 0.3%, and also surrounded by the x axis, and the amount of change in the amount of strain when tensile stress is 0, before and after applying tensile stress, is 0.05% or less.

2. The prepreg according to claim 1, wherein the cured product exhibits a feature in which the ratio of
    a second proportion of a change in stress relative to a change in the amount of strain between a first amount of strain when stress is 0 and a second amount of strain resulting from adding 0.1% to the first amount of strain on the curve $f2(x)$ to
    a first proportion of a change in stress relative to a change in the amount of strain at an amount of strain of 0% to 0.1% on the curve $f1(x)$ is 0.5 or less.

3. The prepreg according to claim 1, wherein the cured product exhibits a feature in which the ratio of
    tensile stress on a stress-strain curve $f2(0.15)$ to
    tensile stress on a tensile stress-strain curve $f1(0.15)$ when the amount of strain is 0.15% is less than 0.9.

4. The prepreg according to claim 1, wherein the curve $f2(x)$ is formed such that the amount of strain is reduced by decreasing tensile stress by pulling at 1 μm/min after having held the amount of strain at 0.3% for 1 minute.

5. The prepreg according to claim 1, wherein the cured product exhibits a feature in which the ratio of
    a fourth proportion of a change in stress relative to a change in the amount of strain between an amount of strain of 0.2% and 0.3% on a tensile stress-strain curve $f3(x)$ when the amount of strain is increased from 0% to 0.3% by pulling at 100 μm/min while plotting the amount of strain on the x axis and stress on the y axis to
    a third proportion of a change in stress relative to a change in the amount of strain between an amount of strain of 0.2% and 0.3% on the curve $f1(x)$ is 0.8 or less.

6. The prepreg according to claim 1, wherein the cured product exhibits a feature in which the ratio of
    the minimum value of stress when the amount of strain has been maintained at 1% to
    the maximum value of stress when pulled so that the amount of strain is 1% is 0.05 to 0.95.

7. The prepreg according to claim 1, wherein the stress response behavior is stress response behavior in which increases and decreases in the amount of strain are repeated two or more times.

8. The prepreg according to claim 1, which contains at least one curable resin selected from the group consisting of epoxy resin, phenolic resin, imide resin, cyanate ester resin and vinyl ester resin.

9. A metal-clad laminated board obtained by laminating a metal foil onto the prepreg according to claim 1, followed by hot press molding.

10. A prepreg comprising a semi-hard (B-stage) product of a resin varnish which contains:
    the resin composition according to claim 1.

11. A metal-clad laminated board consisting of a laminate of
    a metal foil and
    the cured product of the prepreg according to claim 10.

12. A printed wiring board comprising a cured product of the prepreg according to claim 10.

* * * * *